(12) United States Patent
Gupta et al.

(10) Patent No.: US 9,865,316 B2
(45) Date of Patent: Jan. 9, 2018

(54) MEMORY WITH A WORD LINE ASSERTION DELAYED BY A BIT LINE DISCHARGE FOR WRITE OPERATIONS WITH IMPROVED WRITE TIME AND REDUCED WRITE POWER

(71) Applicant: QUALCOMM Incorporated, San Diego, CA (US)

(72) Inventors: Sharad Kumar Gupta, Bangalore (IN); Mukund Narasimhan, Bangalore (IN); Veerabhadra Rao Boda, East Godavari (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/003,444

(22) Filed: Jan. 21, 2016

(65) Prior Publication Data

US 2017/0213587 A1 Jul. 27, 2017

(51) Int. Cl.
| | | |
|---|---|---|
| *G11C 7/00* | (2006.01) | |
| *G11C 7/22* | (2006.01) | |
| *G11C 11/419* | (2006.01) | |
| *G11C 11/418* | (2006.01) | |
| *G11C 7/12* | (2006.01) | |
| *G11C 8/08* | (2006.01) | |
| *G11C 8/10* | (2006.01) | |
| *G11C 8/18* | (2006.01) | |

(52) U.S. Cl.
CPC ............... *G11C 7/227* (2013.01); *G11C 7/12* (2013.01); *G11C 7/22* (2013.01); *G11C 8/08* (2013.01); *G11C 8/10* (2013.01); *G11C 8/18* (2013.01); *G11C 11/418* (2013.01); *G11C 11/419* (2013.01); *G11C 2207/229* (2013.01)

(58) Field of Classification Search
CPC ........ G11C 7/12; G11C 7/227; G11C 11/4099; G11C 11/4094; G11C 2207/229; G11C 7/22; G11C 8/08; G11C 8/10; G11C 8/18
See application file for complete search history.

(56) References Cited

U.S. PATENT DOCUMENTS

| | | | |
|---|---|---|---|
| 4,989,182 A | 1/1991 | Mochizuki et al. | |
| 5,818,775 A * | 10/1998 | Torelli | G11C 11/418 365/195 |
| 6,252,814 B1 | 6/2001 | Tran et al. | |
| 6,801,460 B2 | 10/2004 | Fukiage | |
| 7,355,915 B2 | 4/2008 | Gouin et al. | |
| 8,045,413 B2 | 10/2011 | Demone | |
| 8,958,237 B1 | 2/2015 | Yang et al. | |
| 2004/0202039 A1 | 10/2004 | Takayanagi | |
| 2007/0280022 A1 | 12/2007 | Nguyen et al. | |
| 2008/0298143 A1 | 12/2008 | Chen et al. | |
| 2009/0040846 A1 | 2/2009 | Chang | |
| 2009/0231934 A1 * | 9/2009 | Jung | G11C 7/08 365/189.15 |
| 2011/0110174 A1 * | 5/2011 | Cho | G11C 7/08 365/194 |

(Continued)

OTHER PUBLICATIONS

International Search Report and Written Opinion—PCT/US2016/067348—ISA/EPO—Feb. 24, 2017.

*Primary Examiner* — Kretelia Graham
(74) *Attorney, Agent, or Firm* — Haynes and Boone, LLP

(57) ABSTRACT

A memory is provided in which the word line assertion during a write operation is delayed until the discharge of a dummy bit line is detected.

10 Claims, 4 Drawing Sheets

(56) References Cited

U.S. PATENT DOCUMENTS

2013/0182514 A1 7/2013 Ge et al.
2013/0194882 A1* 8/2013 Ishii ..................... G11C 7/222
                                                     365/194

* cited by examiner

MEMORY WITH A WORD LINE ASSERTION DELAYED BY A BIT LINE DISCHARGE FOR WRITE OPERATIONS WITH IMPROVED WRITE TIME AND REDUCED WRITE POWER

TECHNICAL FIELD

This application relates to integrated circuit memories, and more particularly to a memory with improved write time and reduced write power.

BACKGROUND

Static random access memory (SRAM) bitcells are arranged into rows and columns. Each row is accessed by a corresponding word line. The columns each have a corresponding bit line pair including a true bit line and a complement bit line. Each bitcell thus lies at an intersection of a word line and a bit line pair. When a word line is asserted, each bitcell in the corresponding row is coupled to the bit line pair for the bitcell's column.

In a write operation, a write driver discharges one of the bit lines in the column for an accessed memory cell while the corresponding word line is asserted. Prior to the write operation, all the bit line pairs are charged to a power supply voltage VDD. The write driver then discharges to ground either the true bit line or the complement bit line in the accessed column depending upon the binary value to be written to the corresponding bitcell.

To improve density, it is conventional for a set of columns to be multiplexed to a given write driver. For example, a conventional write driver includes a write bit gdin<0> and another for bit gdin<1>. Each write driver comprises a pair of inverters. A true bit line inverter in the pair drives the accessed true bit line by inverting the corresponding gdin write bit. A complement bit line inverter drives the accessed complement bit line by inverting the corresponding complement bit gdin_n.

In this example, there are eight columns being multiplexed. A selected one of columns 0 through Column 3 is driven by the write driver for write bit gdin<0> depending upon a set of write multiplexer bits wm<0> through wm<3>. In this case, wm<0> is asserted true while wm<1> through wm<3> are low. Thus, only column 0 is driven by the write driver in this particular write operation.

One word line from a set of word lines WL<0> through WL<n> is asserted by the same timing path used for a read operation. This common timing means that the word line will be asserted well before the write driver can discharge the appropriate bit line in the accessed column (Col. 0 being the accessed column in this example).

Since the word line is asserted during the write operation while the write driver is attempting to discharge a bit line, an unintended partial read operation occurs in the accessed bitcell depending upon its binary content. For example, suppose the write driver is attempting to discharge the true bit line in Col. 0 but that the accessed memory cell is storing a complementary binary state. The accessed memory cell will thus partially discharge the complement bit line while the write driver is discharging the true bit line. The complement situation may occur when the write driver is discharging the complement bit line but the accessed bit line is discharging the true bit line. In both cases, the unintended partial read operation undesirably lengthens the write time requirement and lowers write robustness. This delay is exacerbated in modern high-density architectures such as in a FinFET process node in which negative bit line boost techniques are employed.

In addition, the bitcells in the unselected columns across the accessed row will also perform such a partial unintended read operation, which undesirably wastes power. This power dissipation is increased as the column mux factor for the write driver is increased (e.g., in a 16:1 column muxing, 15 columns will droop one of their bit lines depending upon the binary content in the corresponding bitcells).

Accordingly, there is a need in the art for improved memory architectures that reduce power consumption and increase speed for write operations.

SUMMARY

To reduce power consumption and increase operating speed, a memory is provided with a row decoder having a word line delay logic circuit that delays the assertion of an addressed word line for a write operation until a dummy bit line is discharged. The word line delay logic circuit does not delay the assertion of an addressed word line during a read operation. The dummy bit line is electrically matched to the bit lines in the memory. In this fashion, the row decoder will not assert the addressed word line during a write operation until the appropriate bit line in an accessed column is discharged. Moreover, this timing is independent of the memory dimensions and process node since all such vagaries are captured by the modeling in the dummy bit line. Power is not wasted by unintended partial read operations in the bitcells coupled to the addressed word line. Moreover, since the write driver no longer must struggle against partial read operations, memory operating speed is increased.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

To increase write speed operation and reduce write power consumption, an integrated circuit memory such as a static random access memory (SRAM) is provided in which the timing path for a word line assertion in a write operation is independent from the timing path for a word line assertion in a read operation. Both timing paths may pass through a row decoder that decodes a read or write address responsive to an edge of a memory clock to so that the appropriate word line may be asserted. In contrast to the word line assertion during a read operation, the assertion of a word line during a write operation is delayed until a dummy bit line voltage has been discharged. So although both the read address and the write address are decoded responsive to an edge of the memory clock, the subsequent assertion of the selected word line is delayed in a write operation as compared to the word line assertion during a read operation. In this fashion, partial read operations during a write operation are avoided in that a write driver will have developed the appropriate voltages on a selected bit line pair for a write operation prior to the assertion of the corresponding word line. The elimination of partial read operations saves power. Moreover, the resulting write operation speed is enhanced since the selected bit lines during a write operation can have their voltages developed by the write driver without any struggle from a partial read operation. These advantageous features may be better appreciated with regard to the following example embodiments.

Figure 1A:
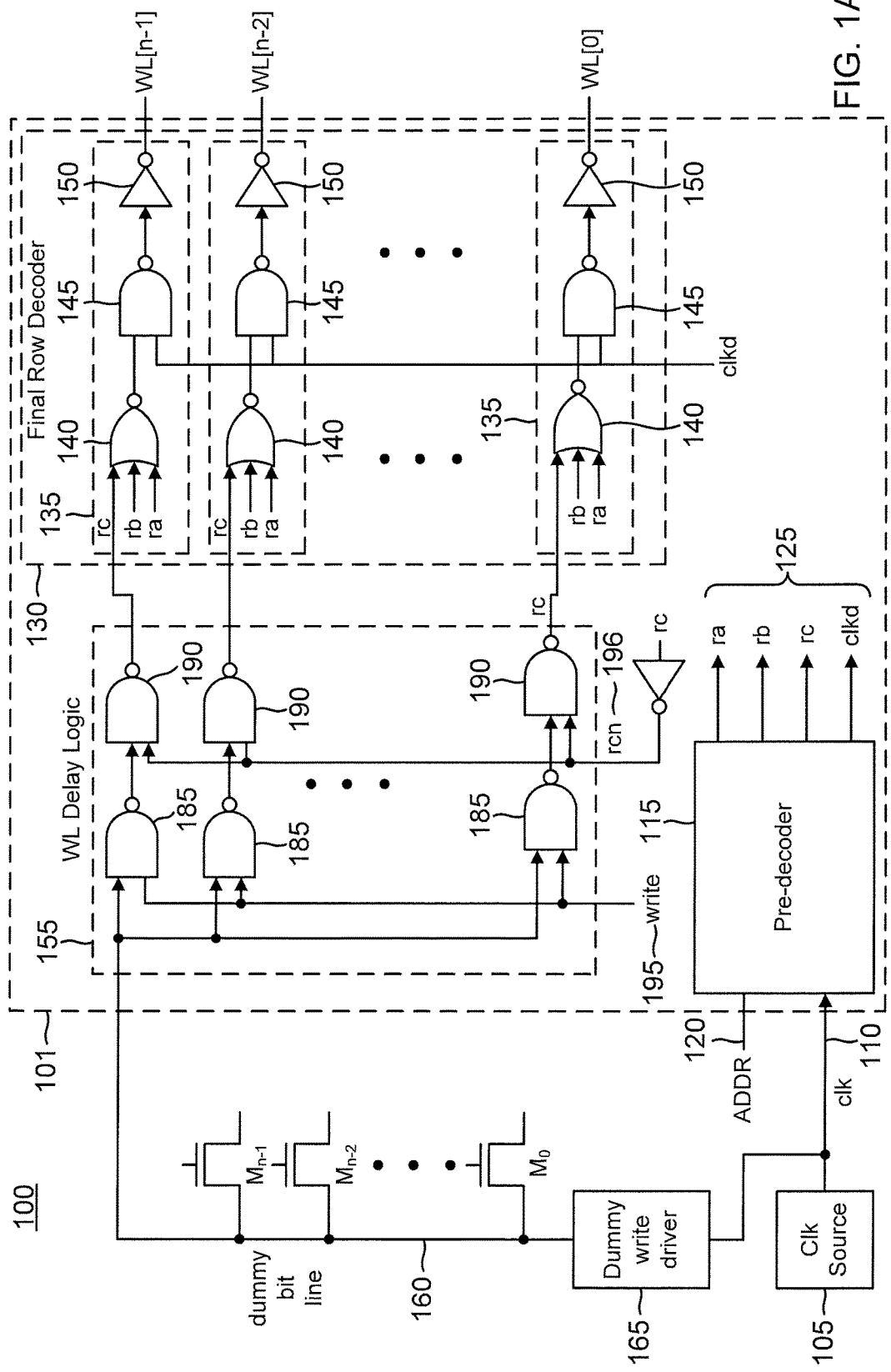
FIG. 1A is a circuit diagram of a row decoder for a memory in accordance with an aspect of the disclosure.
Figure 1B:
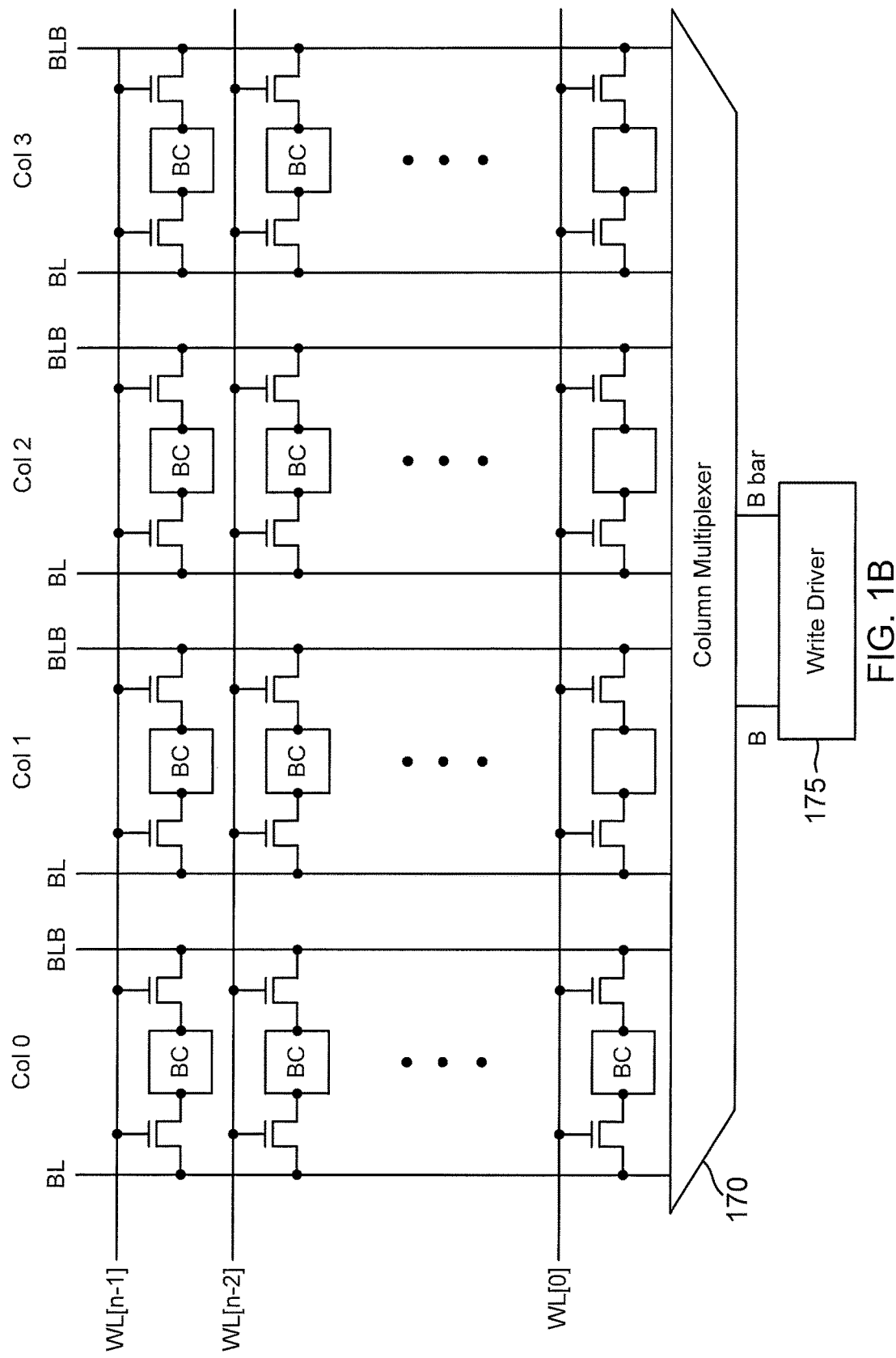
FIG. 1B is a circuit diagram of a plurality of word lines and bitcells for the memory of FIG. 1A.

Turning now to the drawings, an example memory 100 is shown in FIG. 1A and FIG. 1B. In particular, FIG. 1A is directed to a row decoder 101 for memory 100 whereas FIG. 1B is directed to a plurality of bit lines and corresponding bitcells for memory 100. The following discussion will be directed to a two-level embodiment for row decoder 101 that includes a predecoder 115 and a final row decoder 130. Such multi-level decoding is advantageous in a complementary metal oxide semiconductor (CMOS) process to reduce fan-out, propagation delay, and layout issues. However, it will be appreciated that row decoder 101 may be implemented as a single-level decoder in alternative embodiments. Regardless of whether row decoder 101 is multi-level or single-level, it is configured to delay the selected word line assertion in a write operation responsive to an edge of a memory clock 110 as compared to a selected word line assertion in a read operation responsive to an edge of memory clock 110.

To perform this selective delay of the word line assertion for write operations as compared to read operations, memory 100 includes a dummy write driver 165 and a dummy bit line 160. Memory 100 also includes a plurality of n word lines ranging from a zeroth word line WL[0] to an (n−1)th word line WL[n−1] as shown in FIG. 1B, where n is a positive integer. Referring again to FIG. 1A, row decoder 101 decodes an address (ADDR) 120 in both a read operation and a write operation to assert an addressed one of the word lines. During a read operation, address 120 thus functions as a read address. Similarly, address 120 functions as a write address during a write operation. Row decoder 101 is configured to delay the assertion of the addressed word line during the write operation until dummy bit line 160 is discharged. Row decoder 101 delays the assertion of the addressed word line during a write operation until dummy bit line 160 is detected as being discharged. In contrast, row decoder 101 asserts the addressed word line during a read operation without any dependence on the discharging of dummy bit line 160. The timing path for a read operation in memory 100 responsive to an edge of memory clock 110 thus depends merely on the time necessary for decoding address 120 and the assertion of the addressed word line voltage. But the timing path for a word line assertion in a write operation responsive to an edge of memory clock 110 depends upon the discharge of dummy bit line 160 in addition to the time necessary to decode address 120 and assert the voltage of the addressed word line. The timing path for a write operation in memory 100 is thus delayed with respect to the timing path for a read operation in memory 100.

In both the write and read operations, a memory clock source 105 generates memory clock 110. An edge of memory clock 110 triggers predecoder 115 to predecode address signal 120. Predecoder 115 generates a plurality of predecoded address signals 125 such as signals ra, rb, and rc. In addition, predecoder 115 generates a row address decoder selection signal clkd. If selected by row address decoder selection signal clkd, a final row decoder 130 decodes predecoded address signals ra, rb, and rc to assert a corresponding one of the n word lines. For example, should n equal 64, the selection of one of the word lines would thus require 6 bits in address signal 120. Each of pre-decoded address signals ra, rb, and rc would be a 4-bit wide signal resulting from the predecoding of two corresponding address bits in such an embodiment. For example, predecoded address signal ra may range from a zeroth bit ra<0> to a third bit ra<3>, rb may range from a zeroth bit rb<0> to a third bit rb<3>, and so on.

Each word line is selected by a unique set of predecoded address signals ra, rb, rc, and clkd. For example, in an embodiment in which memory 100 includes 256 word lines, address signal 120 would be an 8-bit signal. The word lines may be organized into four sets of 64 word lines each (n=63), each set having its own final row decoder 130. Since there would be four word line sets in such an embodiment of memory 100, two bits of address signal 120 may be predecoded to form an active-high row address decoder selection signal clkd<0:3>. Similarly, another two bits of address signal 120 may be predecoded to form active-low predecoded address signal ra<0:3>, another two bits for active-low predecoded address signal rb<0:3>, and a final two bits for active-low predecoded address signal rc<0:3>. For a set of sixty-four word lines addressed through final row decoder 130, only six address bits are necessary. For example, the signals clkd<0:3>, ra<0:3>, and rb<0:3> may select for one of the sixty-four word lines. The bit index for the signals ra, rb, rc, and clkd is not shown in FIG. 1A for illustration clarity. It will be appreciated that the number of word lines may be varied in alternative embodiments.

Final row decoder 130 includes a plurality of row decoder logic circuits 135 for decoding predecoded address signals 125 and row address decoder selection signal clkd so that a voltage for the addressed word line may be asserted to a power supply voltage level (VDD). For example, each row decoder logic circuit 135 may include a NOR gate 140 for decoding predecoded address signals ra, rb, and rc. In such a NOR-based decoder embodiment, predecoded address signals ra, rb, and rc are asserted low (grounded) to select for the corresponding word line. In alternative embodiments, other types of row decoder logic circuits may be used such as AND-gate-based row decoder logic circuits in which the corresponding predecoded address signals must be asserted high to a power supply voltage to select for the addressed word line. As used herein, predecoded address signals such as ra, rb, and rc are deemed to be "asserted" when their binary state selects for the addressed word line, regardless of whether that assertion is to ground or to a power supply voltage.

Each NOR gate 140 will drive its their output signal high to a power supply voltage when the corresponding predecoded address signals are asserted. A NAND gate 145 in each row decoder logic circuit 135 receives the output signal from the corresponding NOR gate 140 as well as the row decoder selection signal clkd. If both the NOR gate output and the row decoder selection signal clkd are binary ones (charged to the power supply voltage), the output signal from NAND gate 145 will go low. This low state is inverted by an inverter 150 in each row decoder logic circuit 135 to assert the addressed word line to the power supply voltage.

Predecoded address signals ra and rb couple directly from predecoder 115 to final row decoder 130. In contrast, predecoded address signal rc couples to final row decoder 130 through a word line (WL) delay logic circuit 155 that depends on a dummy bit line 160 discharge as follows. A dummy write driver 165 is triggered by the same edge of memory clock 110 that triggered predecoder 115 to discharge dummy bit line 160. As will be explained further herein, dummy bit line 160 models the electrical behavior of an actual bit line in memory 100. Referring again to FIG. 1B, a plurality of bit cells (BC) are arranged in rows and columns. Memory 100 in configured for a 4:1 column multiplexing with regard to a write driver 175 that drives a bit signal B and a complement bit signal B bar through a 4:1 multiplexer 170 to a selected column ranging from a column (Col) 0 to a column 3. It will be appreciated that different orders of column multiplexing may be used in alternative embodiments. Each column includes a true bit line (BL) and a complement bit line (BLB) bit line pair that couples to n bit cells through corresponding pairs of access transistors controlled by the corresponding word lines. To electrically model each bit line BL (or BLB), dummy bit line 160 couples to n dummy access transistors so that it has the same capacitive loading. Thus, dummy bit line 160 will discharge at the same time that a bit line selected by column multiplexer 170 will discharge.

Word line delay logic circuit 155 includes a first logic gate such as a NAND gate 185 for each word line. Since there are n word lines, word line delay logic circuit 155 thus includes n NAND gates 185. Each NAND gate 185 processes the voltage of dummy bit line 160 and a write signal 195 that is asserted during a write operation and de-asserted during a read operation. The output of each NAND gate 185 is thus forced high (to the power supply voltage VDD) during a read operation. During a write operation, write signal 195 is asserted high. Prior to the discharge of dummy bit line 160, the output of each NAND gate 185 will thus be low during the initial portion of a write operation. When dummy bit line 160 discharges below the threshold voltage for NAND gate 185 during a write operation, the output of each NAND gate 185 will go high (asserted to the power supply voltage). Word line delay logic circuit 155 also includes a second logic gate such as a NAND gate 190 for each word line. Since there are n word lines, word line delay logic circuit 155 includes n NAND gates 190. Each NAND gate 190 processes the output of the NAND gate 185 corresponding to the same word line that NAND gate 190 corresponds to. In addition, each NAND gate 190 processes an inverted predecoded address signal rcn 196 produced by the inversion of predecoded address signal rc. Since predecoded address signal rc is active low, inverted predecoded address signal rcn 196 is active high. Inverted predecoded address signal rcn 196 will thus be charged high to the power supply voltage VDD when predecoded address signal rc is asserted low. The output of each NAND gate 185 functions as a word line enable signal for the corresponding word line. During a read operation, the word line enable signals from NAND gates 185 will be asserted high such that the predecoded signal rc may flow through NAND gates 190. But during a write operation, the word line enable signals from NAND gates 185 will only be asserted high after dummy bit line 160 has discharged. The predecoded address signal rc from each NAND gate 190 couples to NOR gate 140 in the row decoder logic circuit 135 corresponding to the same word line that NAND gate 190 corresponds to. The remaining predecoded address signals ra and rb are received at NOR gates 140 directly from predecoder 115. The predecoded address signals ra, rb, and rc may thus be divided into a set of first predecoded address signals such as ra and rb whose assertions are not delayed by word line delay logic circuit 155. But the assertion of least one second predecoded address signal such as rc is delayed by word line delay logic circuit 155 during a write operation. In this fashion, the timing path for a word line assertion during a write operation following a triggering edge of memory clock 110 is delayed with regard to the timing path for a word line assertion during a read operation following a triggering edge of memory clock 110. It will be appreciated that word line delay logic circuit 155 may be replaced by a word line delay logic circuit integrated into predecoder 115 in alternative embodiments. In one embodiment, word line delay circuit 155 may be deemed to comprise a means for delaying one of the predecoded address signals into a delayed predecoded address signal by a delay corresponding to a bit line discharge time. In such an embodiment, signals ra and rb would comprise non-delayed predecoded address signals whereas signal would comprise the delayed predecoded address signal.

Figure 2:
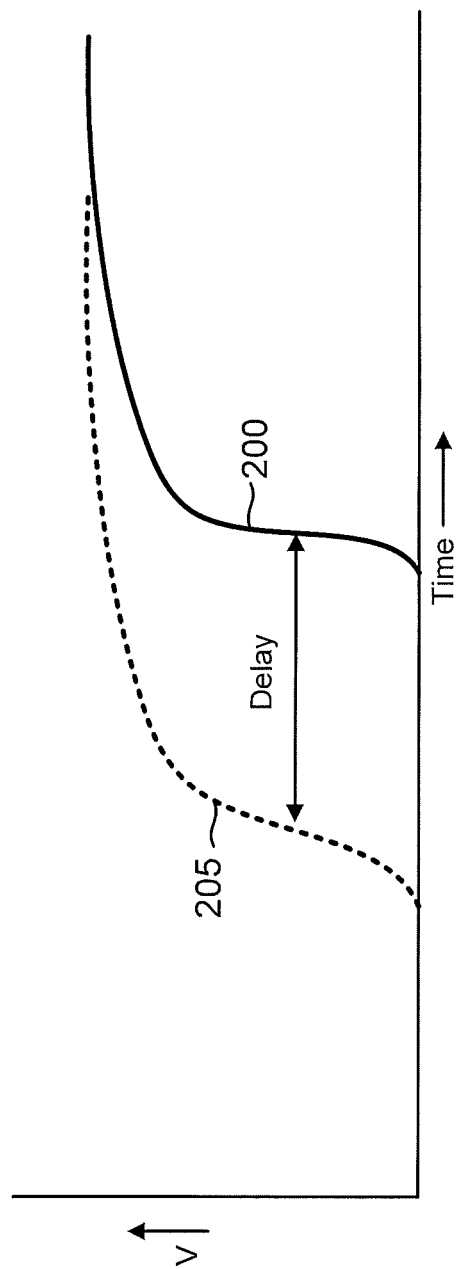
FIG. 2 is a timing diagram comparing the write word line voltage development for memory embodiments disclosed herein as compared to a conventional write word line voltage development.

The selective delay of the word line assertion during a write operation as compared to a conventional word line assertion is shown in FIG. 2. A conventional write word line voltage 205 is triggered by a memory clock edge (not illustrated). The delay from this triggering memory clock edge does not depend on a discharge of a dummy bit line 160 (FIG. 1A). If the same memory clock edge triggers a write operation in memory 100, a write word line voltage 200 results that is delayed with regard to conventional write word line voltage 205 by the dummy bit line discharge time. This delay is quite advantageous. For example, referring again to FIG. 1B, suppose that column 0 is the active column (the column being written to by write driver 175 through selection by column multiplexer 170) and that word line WL[n−1] is the addressed word line. If conventional write word line voltage 205 is applied to word line WL[n−1] in a write operation, a partial read operation occurs in the bitcell BC not only the active column 0 but also for the bitcells BC for word line WL[n−1] in columns 1, 2, and 3. These partial read operations waste power and delay the resulting write operation. In contrast, write word line voltage 200 prevents these partial read operations because word line WL[n−1] could only be asserted after write driver 175 has already discharged the appropriate bit line (either BL or BLB) in column 0. A method of operation for memory 100 will now be discussed for practicing these advantageous features.

Figure 3:
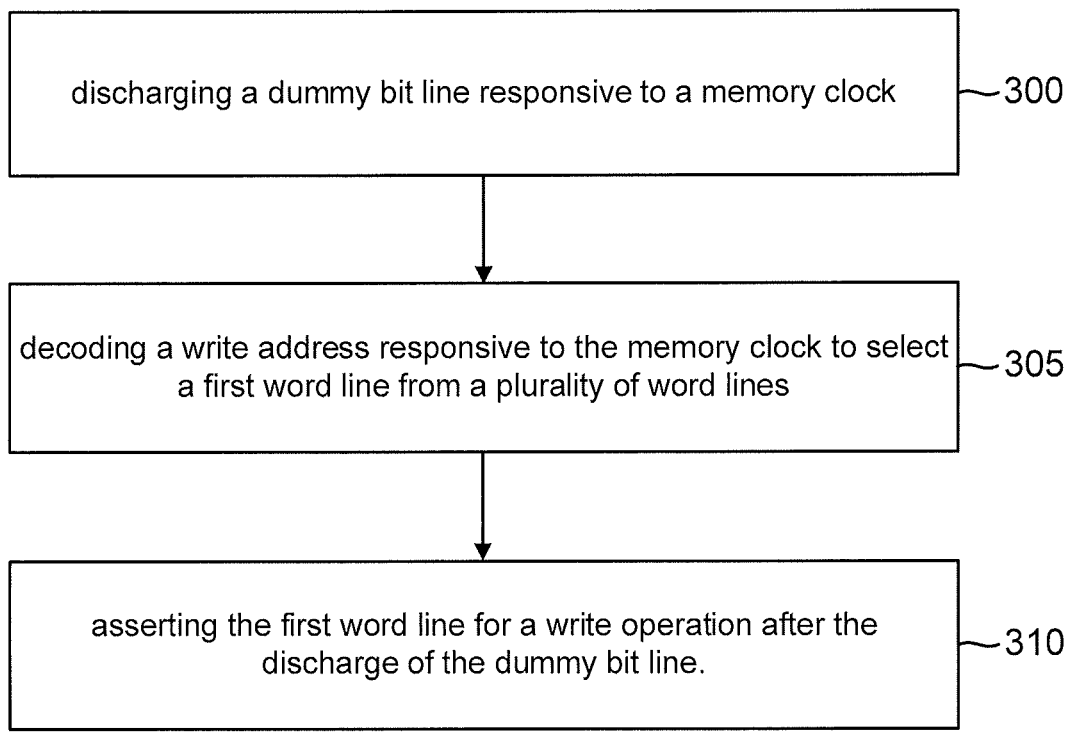
FIG. 3 is an example method of operation for the memory of FIGS. 1A and 1B.

A method of operation for memory 100 is shown in the flowchart of FIG. 3. An act 300 comprises discharging a dummy bit line responsive to a memory clock. The discharge of dummy bit line 160 is an example of act 300. In addition, the method includes an act 305 of decoding a write address responsive to the memory clock to select a first word line from a plurality of word lines. The decoding of address 120 by predecoder 115 and final row decoder 130 is an example of act 305. Finally, the method includes an act 310 of asserting the first word line for a write operation after the discharge of the dummy bit line. The assertion of the addressed word line by final row decoder 130 after the discharge of dummy bit line 160 is an example of act 310.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A memory, comprising:
a plurality of word lines;
a dummy bit line;
a dummy write driver configured to discharge the dummy bit line responsive to a memory clock signal to model a discharge of a bit line during a write operation; and
a row decoder configured to decode an address signal to assert an addressed one of the word lines, wherein the row decoder includes a word line delay circuit configured to delay the decoding of the address signal in the write operation until the dummy bit line is discharged and to not delay the decoding of the address signal in a read operation.

2. The memory of claim 1, wherein the row decoder is a two-level row decoder comprising:
a predecoder configured to predecode the address signal into a plurality of asserted first predecoded address signals and an asserted second predecoded address signal responsive to the memory clock signal;
an inverter for inverting the asserted second predecoded address signal into a second de-asserted predecoded address signal, wherein the word line delay logic circuit is configured to invert the de-asserted second predecoded address signal into a re-asserted second predecoded address signal responsive to the discharge of the dummy bit line during the write operation; and
a final row decoder configured to assert the addressed one of the word lines responsive to the assertion of the plurality of first predecoded address signals and the re-asserted second predecoded address signal.

3. The memory of claim 2, further comprising a plurality of bitcells arranged into a plurality of rows corresponding to a plurality of bit lines and arranged into a plurality of columns, each column having a same number of the bitcells, and wherein the dummy bit line is configured to couple to the same number of dummy bitcells so that dummy bit line has the same capacitive loading as for each bit line in the plurality of bit lines.

4. The memory of claim 2, wherein the word line delay logic circuit comprises a plurality of first logic gates corresponding to the plurality of word lines, each first logic gate configured to process a write signal for triggering the write operation and a voltage for the dummy bit line to produce a word line enable signal for the corresponding word line.

5. The memory of claim 4, wherein each first logic gate comprises a NAND gate.

6. The memory of claim 4, wherein the word line delay circuit further comprises a plurality of second logic gates corresponding to the plurality of word lines, each second logic gate configured to process the word line enable signal for the corresponding word line and the de-asserted second predecoded address signal.

7. The memory of claim 6, wherein each second logic gate comprises a NAND gate.

8. The memory of claim 2, wherein the final row decoder comprises a plurality of row decoder logic circuits corresponding to the plurality of word lines.

9. The memory of claim 8, wherein each row decoder logic circuit comprises a NOR gate configured to NOR the first predecoded address signals and the re-asserted second predecoded address signal to produce a NOR output signal.

10. The memory of claim 9, wherein each row decoder logic circuit further comprises a NAND gate configured to NAND the row decoder logic circuit's NOR output signal and a row address decoder selection signal.

* * * * *